(12) United States Patent
Zur

(10) Patent No.: US 11,636,997 B2
(45) Date of Patent: Apr. 25, 2023

(54) UNIFORM MILLING OF ADJACENT MATERIALS USING PARALLEL SCANNING FIB

(71) Applicant: APPLIED MATERIALS ISRAEL LTD., Rehovot (IL)

(72) Inventor: Yehuda Zur, Tel-Aviv (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 300 days.

(21) Appl. No.: 16/919,013

(22) Filed: Jul. 1, 2020

(65) Prior Publication Data

US 2022/0005670 A1    Jan. 6, 2022

(51) Int. Cl.
*H01J 37/30* (2006.01)
*H01J 37/31* (2006.01)

(52) U.S. Cl.
CPC .......... *H01J 37/3005* (2013.01); *H01J 37/31* (2013.01)

(58) Field of Classification Search
CPC .............................. H01J 37/3005; H01J 37/31
See application file for complete search history.

(56) References Cited

U.S. PATENT DOCUMENTS

2013/0118896 A1   5/2013  Foster et al.
2015/0294885 A1  10/2015  Rue et al.

FOREIGN PATENT DOCUMENTS

KR  20000033152 A  6/2000
KR  20090032013 A  3/2009
WO   2020102899 A1  5/2020

OTHER PUBLICATIONS

PCT/US2021/037669, "International Search Report and Written Opinion", dated Oct. 7, 2021, 10 pages.
PCT/US2021/037669, "International Preliminary Report on Patentability", dated Jan. 12, 2023, 7 pages.

*Primary Examiner* — Joseph L Williams
(74) *Attorney, Agent, or Firm* — Kilpatrick Townsend & Stockton LLP

(57) ABSTRACT

A method of evaluating a region of a sample that includes two or more sub-regions adjacent to each other that have different milling rates. The method can include: scanning a focused ion beam over the region during a single scan frame such that the ion beam is scanned over a first sub-region of the region having a first milling rate at a first scan rate and then scanned over a second sub-region of the region having a second milling rate at a second scan rate, where the second milling rate is faster than the first milling rate and second scan rate is faster than the first scan rate; and repeating the scanning process a plurality of times to etch the region to a desired depth.

20 Claims, 9 Drawing Sheets

UNIFORM MILLING OF ADJACENT MATERIALS USING PARALLEL SCANNING FIB

BACKGROUND OF THE INVENTION

In the study of electronic materials and processes for fabricating such materials into an electronic structure, a specimen of the electronic structure can be used for microscopic examination for purposes of failure analysis and device validation. For instance, a specimen such as a silicon wafer that includes one or more integrated circuits (ICs) or other electronic structures formed thereon can be milled and analyzed with a focused ion beam (FIB) to study specific characteristics of the circuits or other structures formed on the wafer.

In some instances a specimen to be milled can include two or more different areas on the specimen that have different milling rates. The different milling rates can be a result of a variety of different factors, such as, different materials that are deposited or otherwise present in the different areas, different geometries formed in the different areas from the same material, different crystallographic orientations of the same material or a combination of different materials, different orientations and/or different geometries.

Removing one or more selected layers to analyze or study characteristics of a structure on the sample formed with the multiple layers is known as delayering and can be done with a FIB tool. In some instances it is desirable to delayer a portion or region of a specimen that includes two or more sub-regions having different milling rates to a common depth in each of the two or more different sub-regions. The different milling rates of the different sub-regions present challenges, however, for delaying such a specimen in an uniform manner.

BRIEF SUMMARY OF THE INVENTION

Embodiments of the disclosure provide methods and a system for delayering a region of a sample that has two or more adjacent sub-regions that exhibit different milling rates in a manner that creates a uniform milled surface with smooth borderline transitions between of the different sub-regions. Some embodiments enable a delayering process to proceed uniformly between the different sub-regions by using a parallel scanning mode of a focused beam ion (FIB) evaluation system to split the region being milled into sub-regions and altering the beam scanning velocity between the different sub-regions. While some embodiments of the disclosure are particularly well suited for delayering electronic device and other structures formed over a semiconductor substrate, embodiments are not limited to any particular type of sample and can be employed to delayer a variety of different samples.

Some embodiments pertain to a method of evaluating a region of a sample. The sample can include a first sub-region having a first milling rate and a second sub-region, adjacent to the first sub-region, having a second milling rate different than the first milling rate. The method can include milling the region by scanning a focused ion beam over the region a plurality of iterations to etch the region to a desired depth, where each time the focused ion beam is scanned over the region the beam is scanned over a first sub-region at a first scan rate and then scanned over the second sub-region at a second scan rate different than the first scan rate.

Some embodiments pertain to a system for evaluating a region of a sample that includes a first sub-region having a first milling rate and a second sub-region, adjacent to the first sub-region, having a second milling rate different than the first milling rate. The system can include: a vacuum chamber; a sample support configured to hold a sample within the vacuum chamber during a sample evaluation process; a focused ion beam (FIB) column configured to direct a charged particle beam into the vacuum chamber; and a processor and a memory coupled to the processor. The memory can include a plurality of computer-readable instructions that, when executed by the processor, cause the system to mill the region by scanning a focused ion beam over the region a plurality of iterations to etch the region to a desired depth, wherein each time the focused ion beam is scanned over the region the beam is scanned over a first sub-region at a first scan rate and then scanned over the second sub-region at a second scan rate different than the first scan rate.

Various implementations of the embodiments described herein can include one or more of the following features. The first scan rate and second scan rates can be chosen such that the milling step etches, over the plurality of iterations, both the first and second sub-regions to the same desired depth. Each iteration of the milling step can remove approximately one atomic layer of material or less from each of the first and second sub-regions. The milling step can be repeated at least many thousands of times in order to mill the region to the desired depth. The first sub-region can have a first geometry and the second sub-region can have a second geometry different than the first geometry. The first milling rate can be faster than the second milling rate and the first scan rate can be faster than the second scan rate. The region can further include a third sub-region adjacent to at least one of the first or second sub-regions. The third sub-region can have a third milling rate different from each of the first and second milling rates and each time the focused ion beam is scanned over the region in the milling step, the beam can be further scanned over the third sub-region at a third scan rate different than the first and second scan rates where the first, second and third scan rates are selected such that the milling step etches, over the plurality of iterations, each of the first, second and third sub-regions to the same desired depth.

Still other embodiments pertain to a method of evaluating a region of a sample that includes two or more sub-regions adjacent to each other that have different milling rates where the method includes: milling the region by scanning a focused ion beam over a first sub-region of the region having a first milling rate X times and scanning the focused ion beam over a second section of the region having a second milling rate different than the first milling rate Y times, where X and Y are selected to compensate for the difference between the first and second milling rates such that the region is milled a substantially uniform amount; and repeating the milling process a plurality of times to etch the region to a desired depth.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments of the disclosure can delayer a portion of a sample that includes . . . .

Example Focused Ion Beam (FIB) Evaluation Tool

Figure 1:
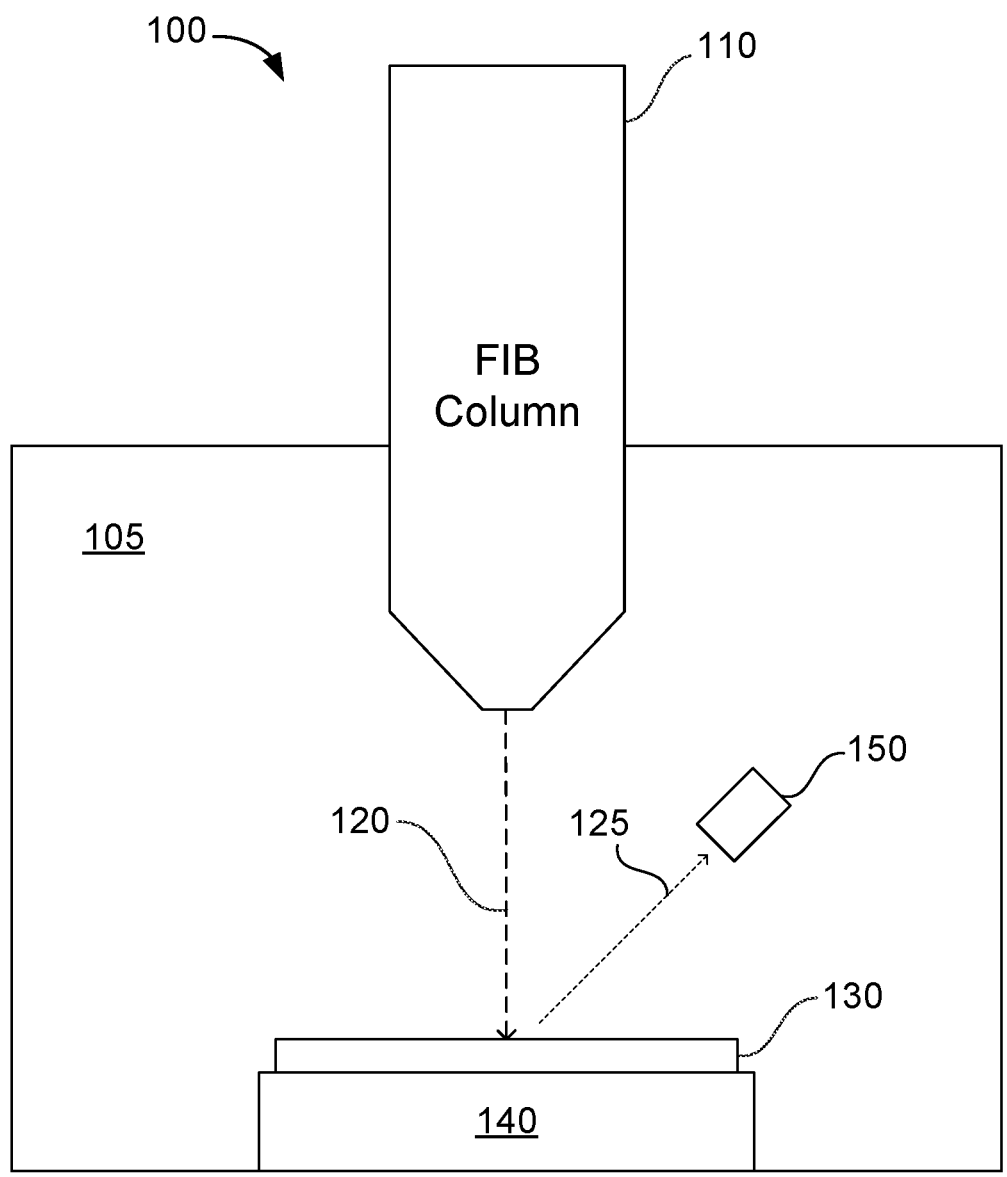
FIG. 1 is simplified illustration of a sample focused ion beam (FIB) evaluation system according to some embodiments of the disclosure.

In order to better understand and appreciate the disclosure, reference is first made to FIG. 1, which is a simplified schematic illustration of a focused ion beam (FIB) evaluation system 100 according to some embodiments of the disclosure. As shown in FIG. 1, system 100 can include, among other elements, a focused ion beam (FIB) column 110, a sample supporting element 140 and a secondary electron detector 150 (or in some embodiments a secondary ion detector or a combination of the two detectors working in parallel). FIB column 110 is operable to generate a charged particle beam 120 and direct the particle beam towards a sample 130 (sometimes referred to herein as an "object" or a "specimen") to mill or otherwise process the sample. The sample, for example a semiconductor wafer, can be supported on a supporting element 140 within a vacuum chamber 105.

FIB column 110 can mill (e.g., drill a recess in) sample 130 by irradiating the sample with charged particle beam 120 to form a cross section and, if desired, can also smooth the cross section. An FIB milling process typically operates by positioning the specimen in a vacuum environment and emitting a focused beam of ions towards the specimen to etch or mill away material on the specimen. In some instances the vacuum environment can be purged by controlled concentration of background gases that serve to help control the etch speed and quality or help control matter deposition. The accelerated ions can be generated from Xenon, Gallium or other appropriate elements and are typically accelerated towards the specimen by voltages in the range from 500 volts to 100,000 volts, and more typically falling in the range from 3,000 volts to 30,000 volts. The beam current is typically in the range from several pico amps to several micro amps, depending on the FIB instrument configuration and the application, and the pressure is typically controlled between $10^{-10}$ to $10^{-5}$ mbar in different parts of the system and in different operation modes.

A delayering process can be done by: (i) locating a location of interest that should be milled in order to remove a certain thickness of material from the sample, (ii) moving the sample (e.g., by a mechanical supporting element) so that the sample is located under the field-of-view of the FIB unit, and (iii) milling the sample to remove a desired amount of material in the location of interest. The delayering process can include forming a recess in the sample (usually sized a few microns to few hundreds of microns in the lateral dimensions).

The milling process typically includes scanning a charged particle beam back-and-forth (e.g., in a raster or other scan pattern) across a particular area of the sample being imaged or milled. One or more lenses (not shown) coupled to the charged particle column can implement the scan pattern as is known to those of skill in the art. The area scanned is typically a very small fraction of the overall area of sample. For example, the sample can be a semiconductor wafer with a diameter of either 200 or 300 mm while each area scanned on the wafer can be a rectangular area having a width and/or length measured in microns or tens of microns. Each iteration (or frame) in which the ion beam is scanned across the region being milled is typically measured in microseconds and removes a very small amount of material (e.g., as low as 0.01 atomic layers using a low i-probe (e.g., 10 pA) or as much as 1000 atomic layers using a high i-probe (1000 nA)) such that the scan pattern is repeated many thousands or millions of times to etch a hole to a desired depth.

During a milling operation the charged particle beam 120 generated by FIB column 110 propagates through the vacuumed environment formed within vacuum chamber 105 before impinging on sample 130. Secondary electrons and ions 125 are generated in the collision of ions with the sample and detected by detector 150. The detected secondary electrons or ions can be used to analyze characteristics of the milled layers and the structure.

While not shown in FIG. 1, FIB evaluation system 100 can include a number of additional components including, but not limited to, one or more gas nozzles to deliver process gases to chamber 105, vacuum and other valves to control the pressure within chamber 105, and one or more lenses to direct the charged particle beam among other components. System 100 can also include one or more controllers, processors or other hardware units that control the operation of system 100 by executing computer instructions stored in one or more computer-readable memories as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

Previously Known Delaying Techniques

Figure 2A:
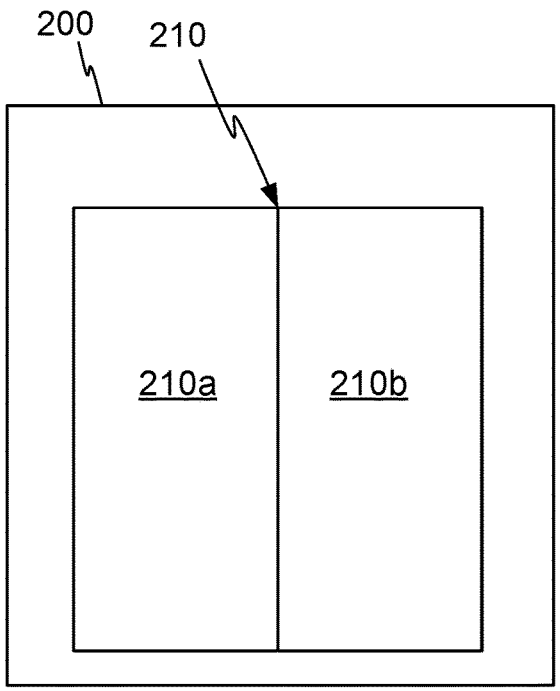
FIG. 2A is a simplified illustration of a sample having a region formed therein that includes first and second sub-regions with different milling rates.

Some commonly employed methods of delayering a region of a sample that has two or more different sections that exhibit different milling rates do so in a manner that creates undesirable boundary (i.e., a region of non-uniformity) between the different sections. To illustrate, reference is made to FIG. 2A, which is a simplified top view illustration of a sample 200. As shown in FIG. 2A, sample 200, which as an example can be a semiconductor wafer, includes a region 210 (sometimes referred to as a "frame") that is to be milled. Region 210 includes two sub-regions 210a and 210b that have different milling rates. For example, the milling rate of region 210a can be faster than the milling rate of 210b. In some instances the different milling rates can be caused, for example, by sub-region 210a being composed primarily of a different material than that of sub-region 210b. In other instances the different milling rates can be caused, for example, by or sub-region 210a having a different geometry than sub-region 210b or a combination of both different materials and different geometries in the two regions.

Figure 2B:
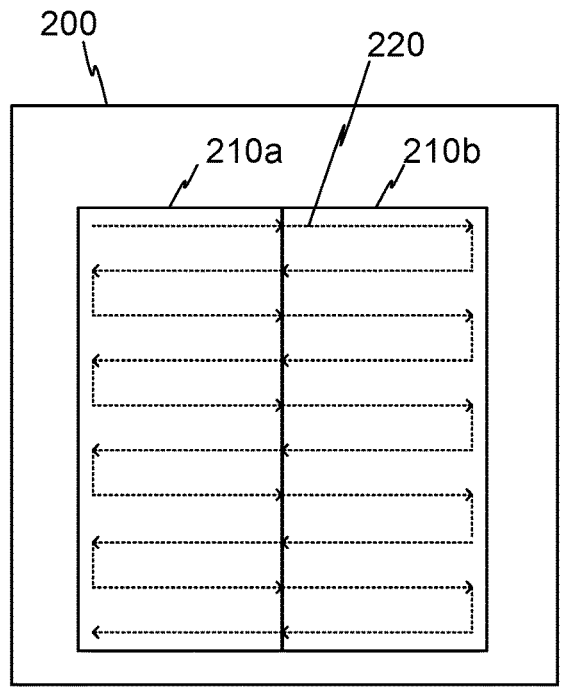
FIG. 2B is a simplified illustration of an ion beam scan pattern used to delayer a portion of the sample shown in FIG. 2A according to a previously known method.

Regardless of the reason for the different milling rates, some previously known milling techniques will mill region 210 by scanning a focused ion beam across the region at a specific (and constant) beam velocity or scan rate. For example, FIG. 2B depicts an exemplary scan pattern 220 used in according to some known methods to delayer the sample 200 shown in FIG. 2A. Scan pattern 220 traverses the entirety of region 210, including both sub-region 210a and sub-region 210b with a single continuously scanned beam at a constant velocity or scan rate and with other parameter of the milling process (e.g., beam width, beam strength, etc.) held constant. As a result, after a predetermined amount of milling (e.g., after the ion beam is scanned across region 210 many thousands of times or even millions of times), region 210 will exhibit a non-uniform profile where the sub-region 210a or 210b having the faster milling rate is milled deeper than the other sub-region with the slower milling rate. The difference in milled depth between the two milled regions creates an edge at the boundary between the two sub-regions.

Figure 2C:
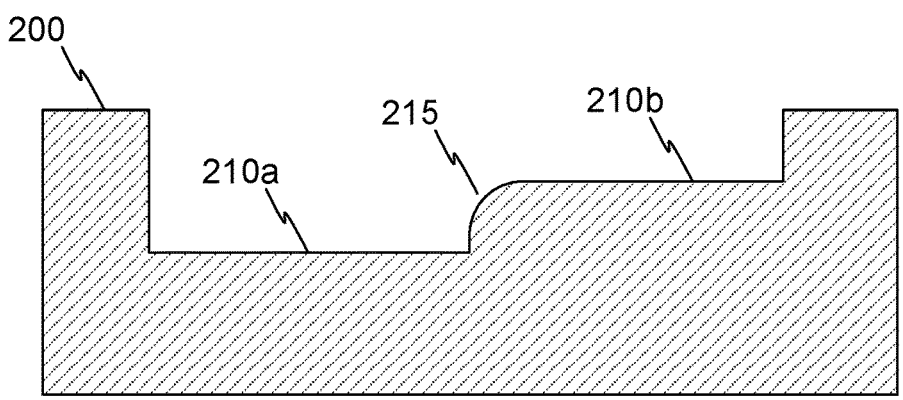
FIG. 2C is a simplified cross-sectional illustration of the sample shown in FIG. 1A after a portion of the sample has been delayered using the previously known scan pattern depicted in FIG. 2B.

As an example, reference is made to FIG. 2C, which is a simplified cross-sectional illustration of sample 200 shown in FIG. 2A after a portion of the sample has been delayered using the scan pattern depicted in and discussed with respect to FIG. 2B. Since sub-region 210a has a faster milling rate than sub-region 210b, after region 210 has been milled many times (e.g., many thousands or even millions of times), the delayering process will result in sub-region 210a having a depth that is greater than that of sub-region 210b thus creating an edge 215 between the two sub-regions.

Figure 3A:
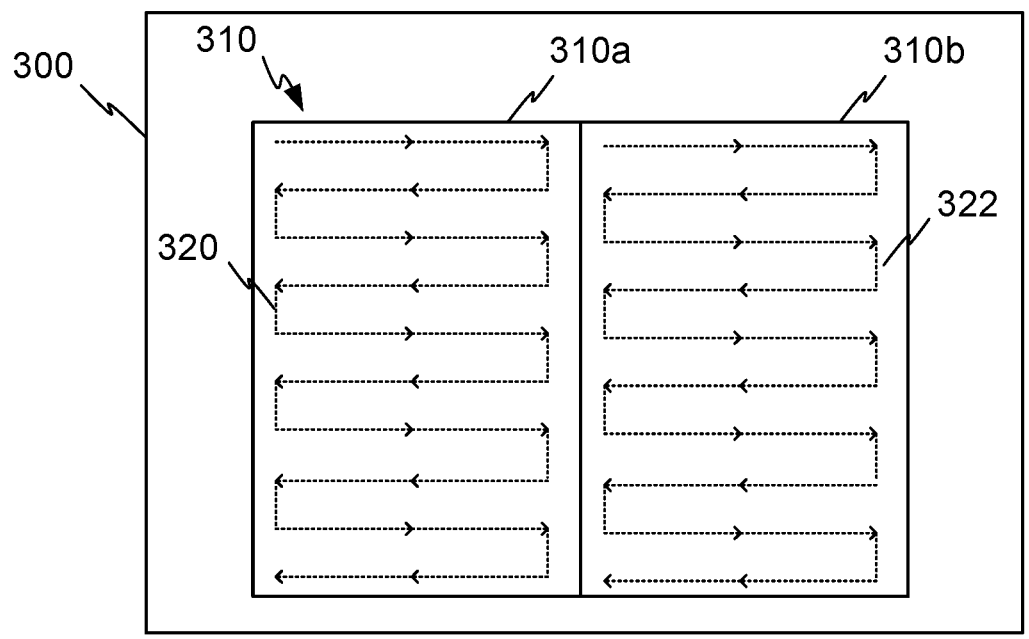
FIG. 3A is a simplified illustration of an ion beam scan pattern used to delayer a portion of a sample having two adjacent sections with different milling rates according to another previously known method.

The presence of edge 215 can be undesirable in some instances and one technique that has been employed to eliminate edge 215 is to mill each of the sub-regions 210a, 210b separately. FIG. 3A is a simplified illustration of an ion beam scan pattern used to delayer a region 310 of a sample 300. Sample 300 can be similar to sample 200 and region 310 can include two adjacent sub-regions 310a, 310b that are similar to sub-regions 210a, 210b described above. In order to compensate for the different milling rates of sections 310a and 310b, some previously employed techniques will mill area 310a to a desired depth using a first scan pattern 320 and then, afterwards, mill area 310b using a second scan pattern 322.

Scanning the two sub-regions 310a, 310b separately in this manner enables the regions to be milled to a substantially similar depth by milling one the sub-regions longer than the other. For example, if sub-region 310a has a milling rate that is twice as fast as sub-region 310b, milling sub-region 301b twice as long (i.e., scanning the ion beam across sub-region 310b twice the number of times as the ion beam is scanned across sub-region 310a) will result in sub-regions 310a and 310b being milled to substantially the same depth.

Figure 3B:
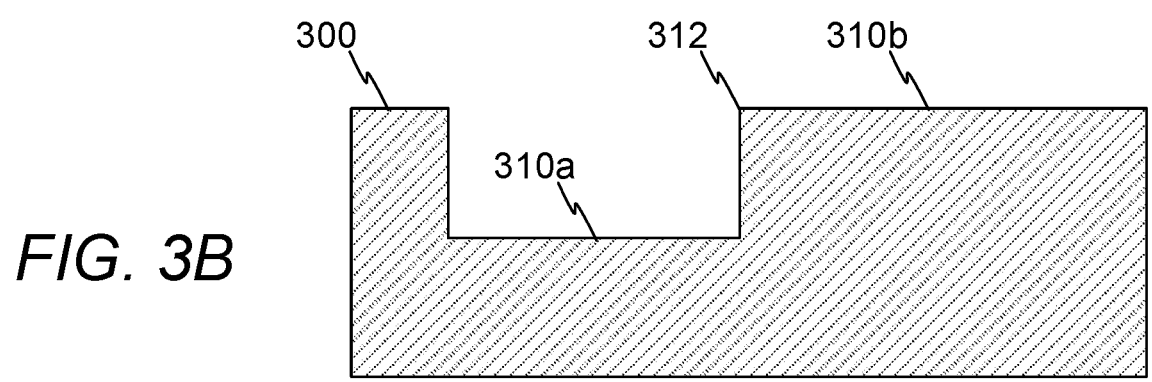
FIG. 3B is a simplified cross-sectional illustration of the sample shown in FIG. 3A after a first sub-region of the sample has been delayered using the previously known scan pattern depicted in FIG. 3A.
Figure 3C:
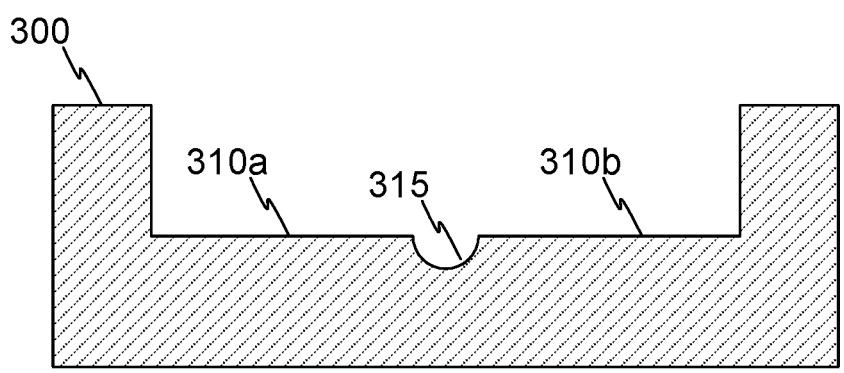
FIG. 3C is a simplified cross-sectional illustration of the sample shown in FIG. 2A after a second sub-region of the sample has been delayered using the previously known scan pattern depicted in FIG. 3A.

Such a process does not necessarily result in a uniform milled surface, however, and instead can create a trench or other non-uniform boundary between the two sub-regions. To illustrate, reference is made to FIGS. 3B and 3C where FIG. 3B is a simplified cross-sectional illustration of sample 300 shown after sub-region 310a has been milled but prior to area 310b being milled and FIG. 3C is a simplified cross-sectional illustration of sample 300 shown after sub-region 310b has been milled. As shown in FIG. 3B, once sub-region 310a is milled to a desired depth an edge 312 exists at the boundary between sub-regions 310a and 310b. When sub-region 310b is subsequently milled, edge region 312 mills at a faster rate than the bulk portions of sub-region 310b.

Thus, when sub-region 310b is subsequently milled to the same depth as sub-region 310a, the faster milling rate around edge region 312 results in an undesirable trench 315 being formed at the boundary between sub-regions 310a and 310b as shown in FIG. 3C. Accordingly, as can be seen, when a region being milled includes two or more sub-regions that exhibit different milling rates, neither of the techniques described with respect to FIG. 2A-2C or 3A-3C result in a uniformly milled surface across the entirety of the region being milled.

Milling with a Varying Scan Rate

Embodiments of the disclosure provide a system and method for milling a region of sample having two or more sub-regions with different milling rates in manner that creates a uniform milled surface without a barrier at boundary of the sub-regions. According to some embodiments a region containing sub-regions of different milling rates is milled such that the velocity of the focused ion beam (i.e., scan rate) is continuously varied while the region is being milled such that the scan rate is different when sub-regions having different milling rates are being milled.

Figure 4:
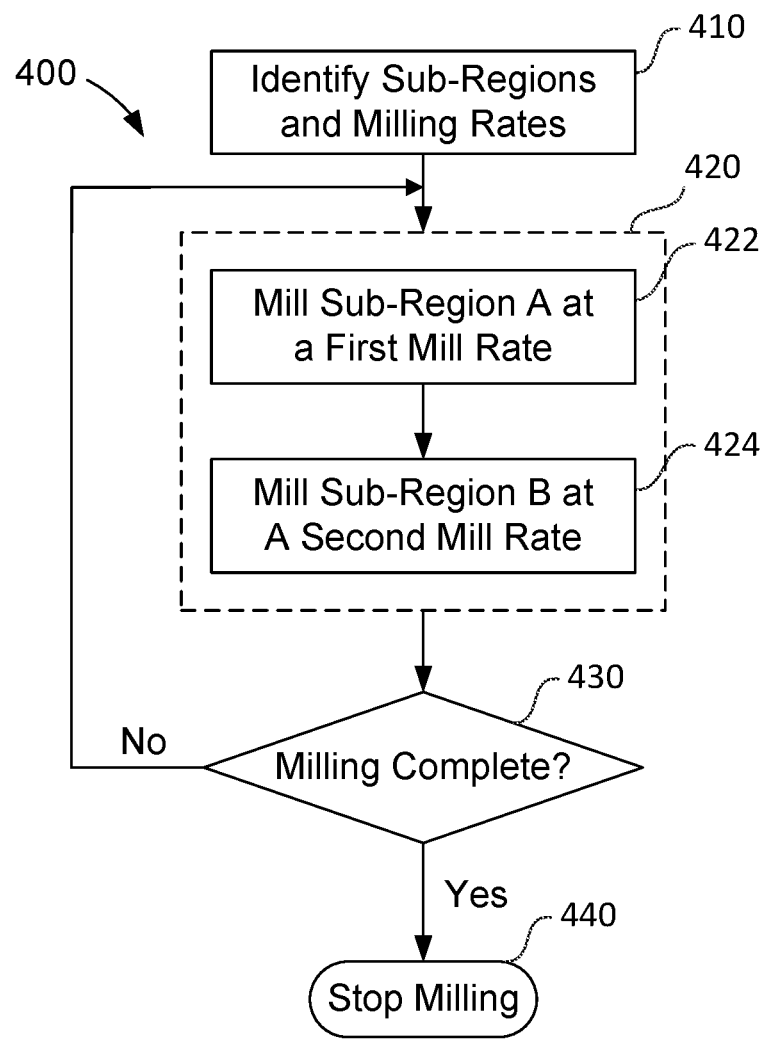
FIG. 4 is a flowchart depicting steps associated with a delayering process according to some embodiments of the disclosure.
Figure 5A:
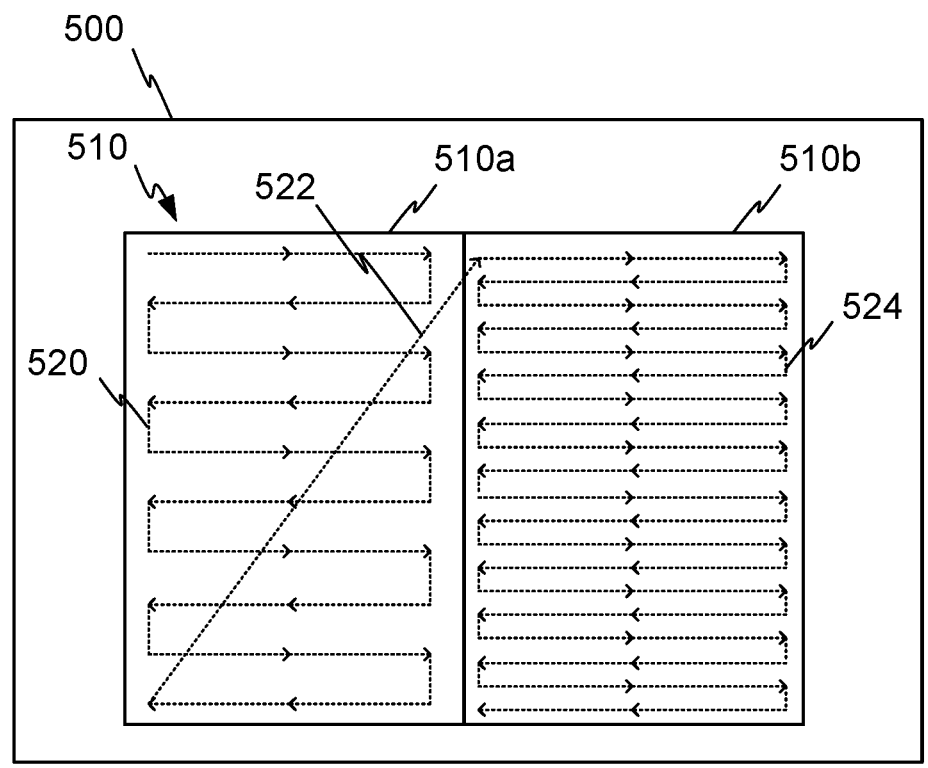
FIG. 5A is a simplified illustration of an ion beam scan pattern used to delayer a portion of a sample having two adjacent sections with different milling rates according to some embodiments of the disclosure.
Figure 5B:
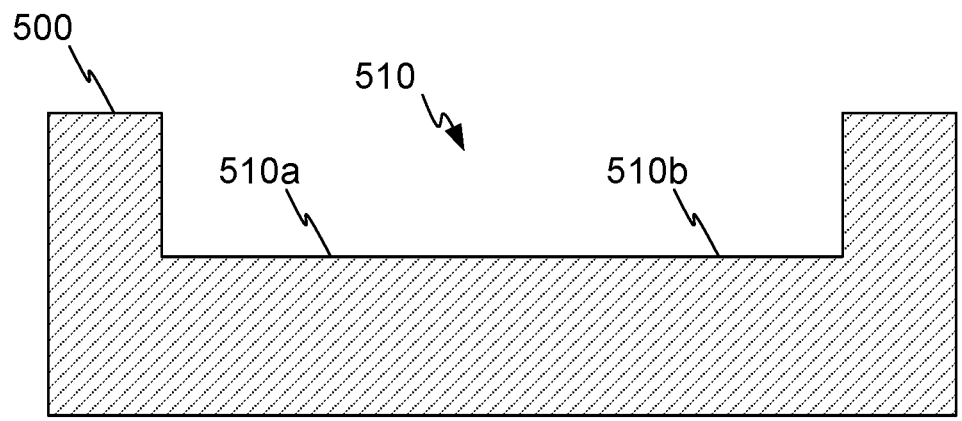
FIG. 5B is a simplified cross-sectional illustration of the sample shown in FIG. 5A after a portion of the sample has been delayered in accordance with the method set forth in FIG. 4 according to some embodiments of the disclosure.

To illustrate reference is made to FIG. 4 and FIGS. 5A and 5B. FIG. 4 is a flowchart depicting steps associated with a delayering process 400 according to some embodiments of the disclosure. FIG. 5A is a simplified illustration of an ion beam scan pattern that can be employed according to process 400 used to delayer a portion of a sample having two adjacent sections with different milling rates according to some embodiments, and FIG. 5B is a simplified cross-sectional illustration of the sample shown in FIG. 5A after a portion of the sample has been delayered in accordance with process 400 according to some embodiments.

Process 400 starts by identifying a region (frame) of a sample to be milled along with two or more sub-regions (sub-frames) within the region (FIG. 4, block 410). For example, as shown in FIG. 5, a sample 500 can include a region 510 to be milled that includes first and second sub-regions 510a and 510b that have different milling rates as described above with respect to sub-regions 210a and 210b. A user can define the boundaries of region 510 along with the boundaries of each sub-region 510a, 510b using software associated with a focused ion beam (FIB) evaluation tool such as system 100 depicted in FIG. 1. The software can further allow the user to assign a specific milling rate to each sub-region 510a, 510b. In some embodiments the milling rates for each sub-region can be previously determined empirically by milling regions similar to sub-regions 510a, 510b on test wafers.

Once the boundaries of the region and each sub-region are defined and milling rates assigned to each sub-region, region 510 can then be milled (FIG. 4, block 420) by repeatedly scanning the ion beam across region 510 many thousands or even millions of times (block 430, milling complete=no) until region 510 is milled to a desired milling depth (block 430, milling complete=yes) and the process is complete (block 440).

In each iteration that region 510 is milled (FIG. 4, block 420), the ion beam is scanned across both sub-region 510a (block 422) and sub-region 510b (block 424). Instead of scanning the entirety of region 510 at the same constant scan rate, however, the velocity of the ion beam can be changed continuously such sub-region 510a is scanned at a different rate than sub-region 510b. For example, if sub-region 510a has milling rate that is twice as fast as sub-region 510b, the beam velocity during each full-frame scan can be twice as fast in sub-region 510a as compared to the beam velocity in sub-region 510b to adjust for the different milling rates.

To further illustrate, referring to FIG. 5A, in each iteration of a full-frame scan of region 510, sub-region 510a can be scanned according to a scan pattern 520, the ion beam can then be directed (dotted line 522) to the beginning of scan pattern 524 and area 520b can be scanned at a faster rate (represented by the more dense scan pattern 524 as opposed to scan pattern 520).

Such fine tuning of beam velocity in the midst of a full-frame scan allows the milling depth to remain constant between sub-regions 510a and 510b throughout the entire milling process without forming an undesirable boundary between sub-regions 510a, 510b. The end result of such a uniform milling process is shown in FIG. 5B where it can be seen that a uniformly flat surface exists across a bottom of the milled region 510 between sub-regions 510a and 510b. Moreover, since sub-regions 510a, 510b are milled together rather than one after the other, the creation of an edge (such as edge 212 shown in FIG. 2B) is avoided which could later cause adverse edge-effects that locally alter the milling rate near the edge and result in the formation of a trench or similar structure between the two sub-regions.

Figure 6:
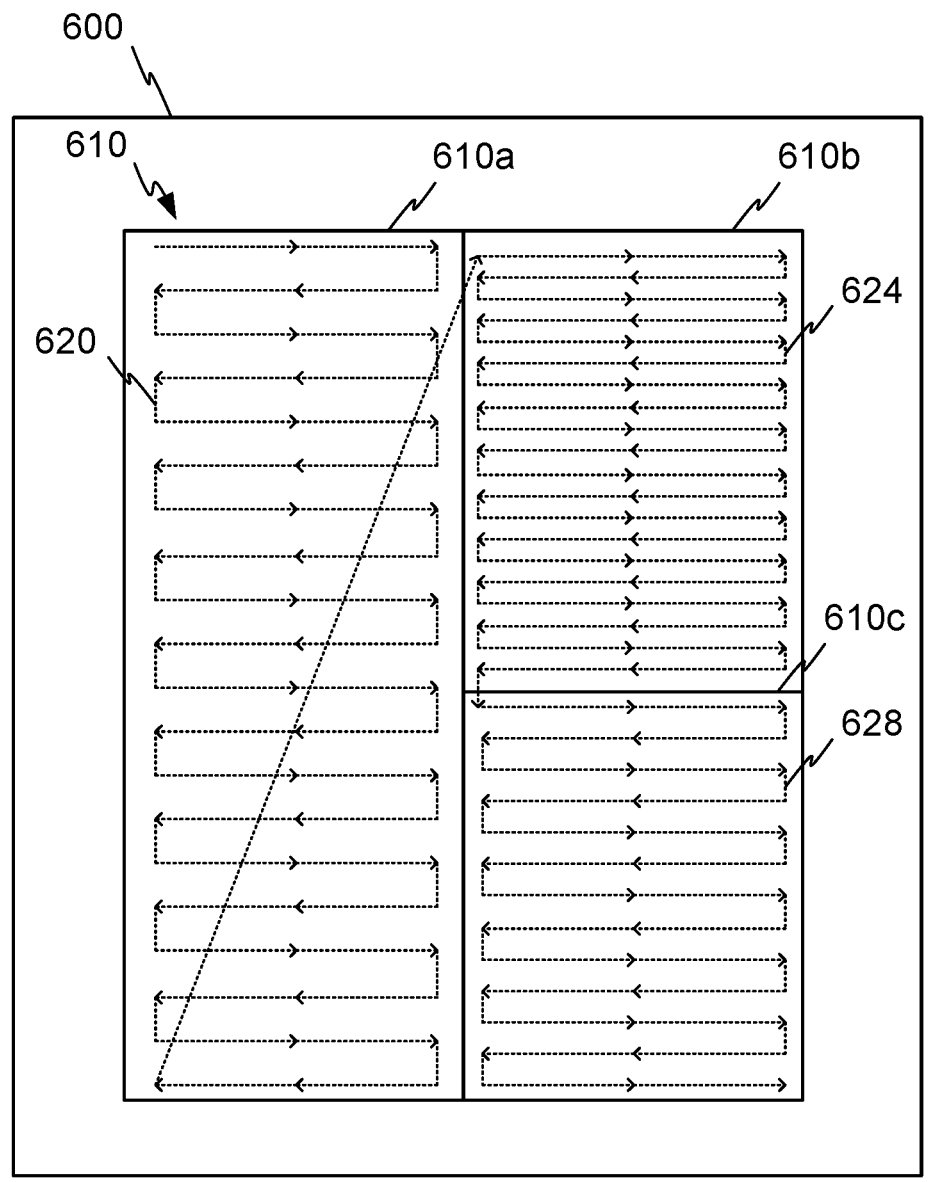
FIG. 6 is a simplified illustration of an ion beam scan pattern used to delayer a portion of a sample having three sections adjacent to each other with different milling rates according to some embodiments of the disclosure.

While the example described in FIGS. 4 and 5A, 5B was for a region 510 being milled that included two different sub-regions having different milling rates, embodiments of the disclosure can be employed to generate a uniform flat surface across a milled region having three, four or more areas having different milling rates. For example, FIG. 6 is a simplified top view of a sample 600 can that includes a region 610 to be milled having three different sub-regions 610a, 610b and 610c that each have different milling rates. As described above with respect to FIG. 4, a user can define the boundaries of region 610 along with the boundaries of each sub-region 610a, 610b and 610c and a milling rate of each sub-region using software associated with a FIB evaluation tool such as system 100.

Then, during each iteration of a full-frame scan (block 420), each of sub-regions 610a, 10b and 610c can be scanned at different beam velocities as represented by the different densities of scan lines 620, 624 and 628, respectively. In this manner, the entirety of region 610 can be milled to create a uniformly flat surface across a bottom of the milled region 610 without any edge effects between any of the sub-regions 610a, 610b or 610c.

Milling Each Sub-Region a Variable Number of Times Per Full-Frame Scan

In some embodiments rather than varying the beam velocity to adjust for different milling rates of sub-regions within a milling frame, embodiments of the disclosure adjust the number of times that the beam is scanned across each sub-region of the milling frame. To illustrate, reference is made to FIGS. 7 and 8 where FIG. 7 is a flowchart depicting the steps associated with a milling method 700 according to some embodiments of the disclosure and FIG. 8 is a simplified top plan view of a sample 800 having a region 800 to be milled that includes sub-regions 810a, 810b that have different milling rates.

Figure 7:
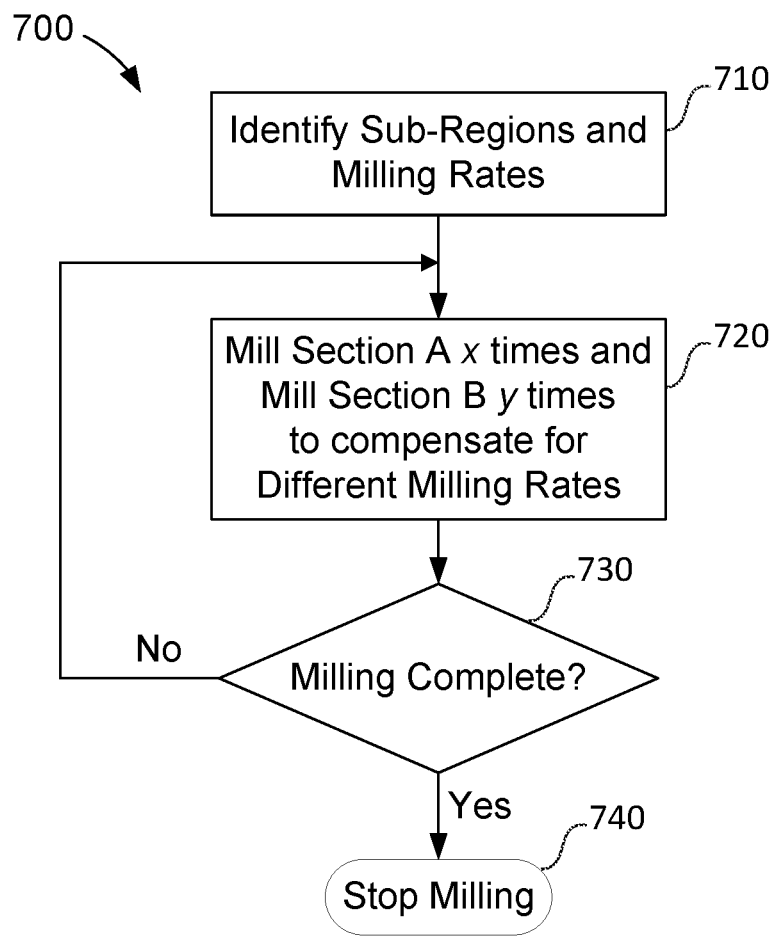
FIG. 7 is a flowchart depicting steps associated with a delayering process according to some embodiments of the disclosure.
Figure 8:
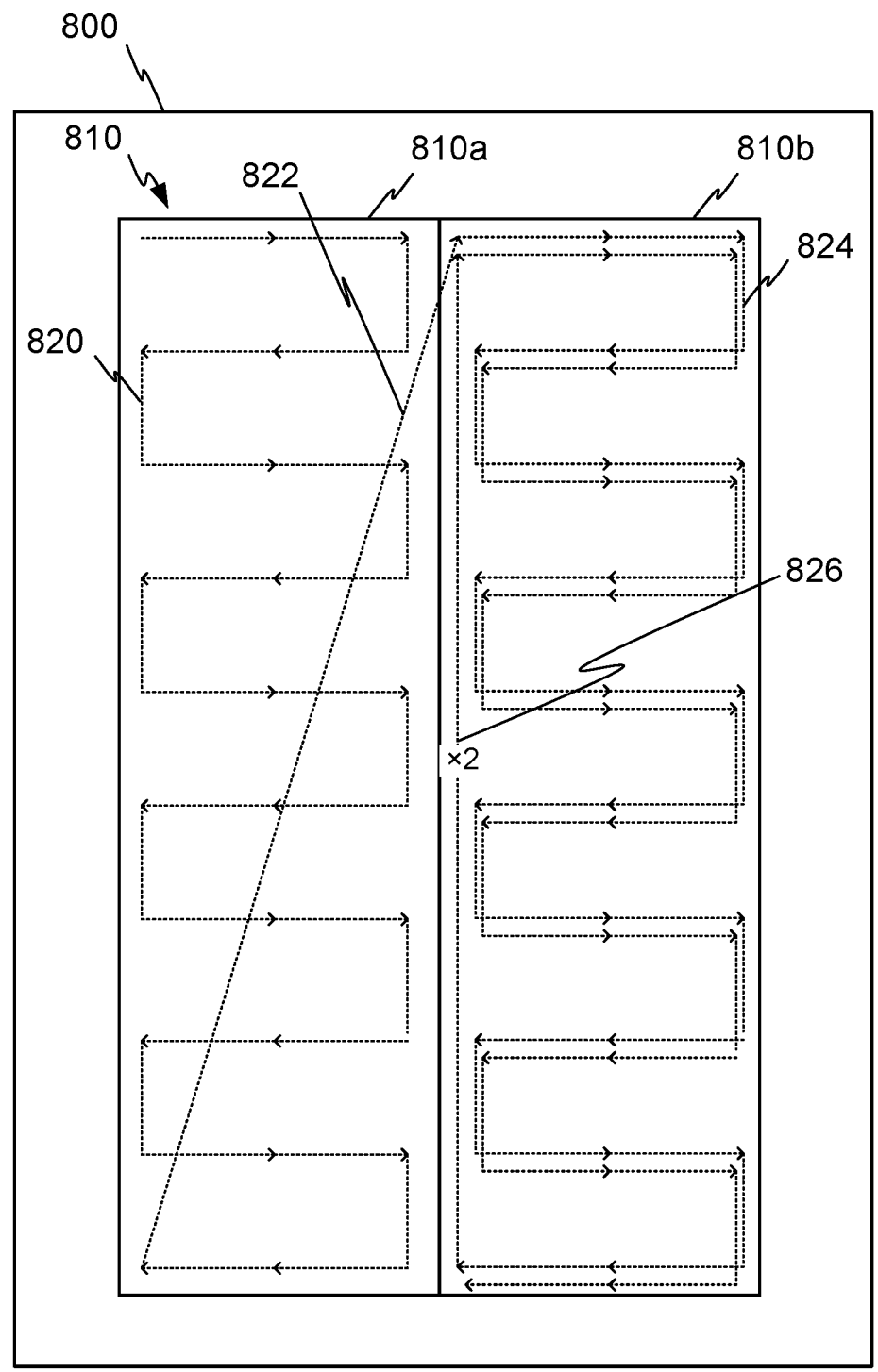
FIG. 8 is a simplified illustration of an area on a semiconductor wafer that can be delayered according to some embodiments.
Figure 9:
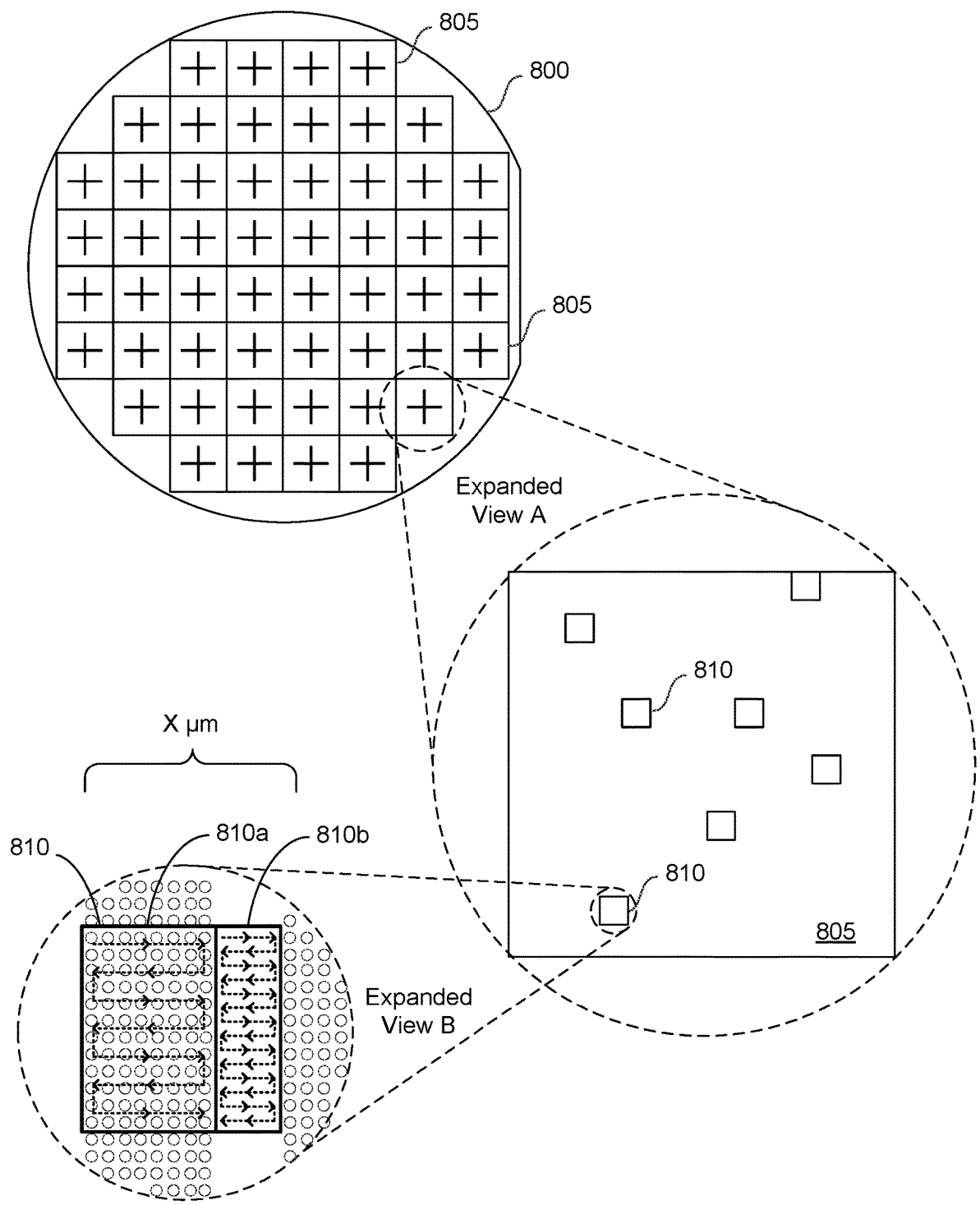
FIG. 9 is a simplified illustration of an area on a semiconductor wafer that can be delayered according to some embodiments.

Similar to method 400, method 700 includes identifying a region (frame) of a sample to be milled along with two or more sub-regions (sub-frames) within the region (FIG. 7, block 710). For example, as shown in FIG. 7, a sample 700 can include a region 710 to be milled that includes first and second sub-regions 710a and 710b that have different milling rates as described above with respect to sub-regions 710a and 710b. A user can define the boundaries of region 710 along with the boundaries of each sub-region 710a, 710b using software associated with a focused ion beam (FIB) evaluation tool such as system 100 depicted in FIG. 1. The software can further allow the user to assign a specific milling rate to each sub-region 710a, 710b. In some embodiments the milling rates for each sub-region can be previously determined empirically by milling regions similar to sub-regions 710a, 710b on test wafers.

Once the boundaries of the region and each sub-region are defined and milling rates assigned to each sub-region, region 710 can then be milled (FIG. 7, block 720) by repeatedly scanning the ion beam across each sub-region 710a, 710b many thousands or even millions of times (block 730, milling complete=no) until region 710 is milled to a desired milling depth (block 730, milling complete=yes) and the process is complete (block 740).

In order to compensate for the different milling rates of sub-regions 710a, 710b, method 700 can adjust the number of times the focused ion beam is scanned across each sub-region relative to the others in step 720 instead of (or in addition to) adjusting the beam velocity of the ion beam in each sub-region. For example, if sub-region 710a has milling rate that is twice as fast as sub-region 710b, during one iteration of block 720, the ion beam can be scanned across sub-region 710a once while being scanned across sub-region 710b twice to make up for the difference in scan rates.

This concept is illustrated in FIG. 8. Specifically, FIG. 8 depicts a scan pattern 820 that represents the ion beam being scanned across sub-region 810a. The beam is then directed via path 822 to region 810b where scan pattern 824 can be implemented at the same beam velocity as scan pattern 820. Once scan pattern 824 is completed, instead of starting a new full frame scan, the ion beam can be directed via path 826 and scan pattern 824 can be implemented a second time within sub-region 810b to adjust for the different scan rates between the two sub-regions. After the second scan of region 810b, assuming region 810 has not yet been milled to the desired depth (block 730, complete=no), block 720 can be repeated by scanning area 810a once and area 810b twice and this process can repeat many thousands or even millions of times until the desired milling depth is reached (block 730, complete=yes).

Method 700 can fine tune via block 720 the number of scans in sub-region 810a to the number of scans in sub-region 810b to account for any difference in the milling rates between the sub-regions. For example, if the milling rate of sub-region 810a is 50% faster than the milling rate of sub-region 810b, the ion beam can be scanned across sub-region 810b three times for every two times it is scanned across sub-region 810a. In some embodiments block 720 can be implemented by alternating the scanning of each sub-region as often as possible while maintaining the ratio. Thus, in the example where sub-region 810b is scanned three time for every two times sub-region 810a is scanned, in some embodiments the ion beam in block 720 could be repeatedly scanned as follows: pattern 820, pattern 824, pattern 820, pattern 824, pattern 824. Since scanning the ion beam across each sub-region sputters away only a very thin layer of material (e.g., about a single atomic layer in some instances), having a different number of iterations of the scan pattern in each sub-region in each iteration of block 720 will not generate undesirable edge effects. As other non-limiting examples, when the milling rates are relatively close to each other but still different, sub-region 810a could be scanned 7 times while sub-region 810b is scanned 10 times or sub-region 810a could be scanned 93 times while sub-region 810b is scanned 100 times. Accordingly, it can be appreciated that any appropriate ratio in the number of times sub-region 810a is scanned versus the number of times sub-region 810b is scanned can be employed in different embodiments as appropriate to compensate for different milling rates of the sub-regions. Similarly, method 700 can be used to uniformly mill regions having three, four or more sub-regions with different milling rates by setting appropriate ratios in the number of times that each of the different sub-regions is scanned in block 720.

Example of a Sample to be Milled

As stated above, embodiments of the disclosure can be used to delayer many different types of samples including electronic circuits formed on semiconductor structures, solar cells formed on a polycrystalline or other substrate, nanostructures formed on various substrates and the like. As one non-limiting example, FIG. 8 is a simplified illustration of an area on a semiconductor wafer that can be delayered according to some embodiments. Specifically, FIG. 8 includes a top view of wafer 800 along with two expanded views of specific portions of wafer 800. Wafer 800 can be, for example, a 200 mm or 300 mm semiconductor wafer and can include multiple integrated circuits 805 (fifty two in the example depicted) formed thereon. The integrated circuits 805 can be at an intermediate stage of fabrication and the delayering techniques described herein can be used to evaluate and analyze one or more regions 810 of the integrated circuits that include two or more sections adjacent to each other that exhibit different milling rates. For example, Expanded View A of FIG. 8 depicts multiple regions 810 of one of the integrated circuits 805 that can be evaluated and analyzed according to the techniques described herein. Expanded View B depicts one of those regions 810 that includes a first section 810a having an array of holes formed therein and a second section 810b that is a generally solid portion separating adjacent arrays of holes. Because of the differing geometries in sections 810a and 810b, the two sections also exhibit different milling rates.

Embodiments of the disclosure can analyze and evaluate region 810 by sequentially milling away an uppermost layer of the region. The milling process can mill region 810 by scanning the FIB beam back and forth within the region according to a raster pattern, such as discussed above with respect to method 400 or method 700. For example, region 810 can be milled in accordance with block 420 by continuously milling the region at a first beam velocity (scan pattern 810a) and then milling region 810b at a second beam velocity (scan pattern 810b) greater than the first beam velocity to compensate for the different milling rates of the two sub-regions.

The removed portion can have a specific depth in the Z direction and can be removed in its entirety from region 810 in both the X and Y directions. For example, if region 810 is a square having a length and width of X microns, separate and very thin slices (as thin as 1 atomic layer or less) of X by X microns can be sequentially removed from region 570 during the milling process where, in each layer, the removed square includes material from sub-region 810a and material from sub-region 810b.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. Also, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings.

Also, any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutandis to a system that is configured to executing instructions stored in the computer program product.

Because the illustrated embodiments of the present disclosure may for the most part, be implemented using electronic components and equipment known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

What is claimed is:

1. A method of evaluating a region of a sample that includes a first sub-region having a first milling rate and a second sub-region, adjacent to the first sub-region, having a second milling rate different than the first milling rate, the method comprising:

milling the region by scanning a focused ion beam over the region a plurality of iterations to etch the region to a desired depth, wherein each time the focused ion beam is scanned over the region the beam is scanned over the first sub-region at a first scan rate and then scanned over the second sub-region at a second scan rate different than the first scan rate.

2. The method of evaluating a region set forth in claim 1 wherein the first scan rate and second scan rate are chosen such that the milling step etches, over the plurality of iterations, both the first and second sub-regions to the same desired depth.

3. The method of evaluating a region set forth in claim 1 wherein:
the region further includes a third sub-region adjacent to at least one of the first or second sub-regions and having a third milling rate different from each of the first and second milling rates;
each time the focused ion beam is scanned over the region in the milling step, the beam is further scanned over the third sub-region at a third scan rate different than the first and second scan rates; and
wherein the first, second and third scan rates are selected such that the milling step etches, over the plurality of iterations, each of the first, second and third sub-regions to the same desired depth.

4. The method of evaluating a region set forth in claim 1 wherein each iteration of the milling step removes approximately one atomic layer of material or less from each of the first and second sub-regions.

5. The method of evaluating a region set forth in claim 1 wherein the milling step is repeated at least many thousands of times in order to mill the region to the desired depth.

6. The method of evaluating a region set forth in claim 1 wherein the first sub-region comprises a first geometry and the second sub-region comprises a second geometry different than the first geometry.

7. The method of evaluating a region set forth in claim 1 wherein the first milling rate is faster than the second milling rate and the first scan rate is faster than the second scan rate.

8. A system for evaluating a region of a sample that includes a first sub-region having a first milling rate and a second sub-region, adjacent to the first sub-region, having a second milling rate different than the first milling rate, the system comprising:
a vacuum chamber;
a sample support configured to hold a sample within the vacuum chamber during a sample evaluation process;
a focused ion beam (FIB) column configured to direct a charged particle beam into the vacuum chamber;
a processor and a memory coupled to the processor, the memory including a plurality of computer-readable instructions that, when executed by the processor, cause the system to mill the region by scanning a focused ion beam over the region a plurality of iterations to etch the region to a desired depth, wherein each time the focused ion beam is scanned over the region the beam is scanned over the first sub-region at a first scan rate and then scanned over the second sub-region at a second scan rate different than the first scan rate.

9. The system set forth in claim 8 wherein the first scan rate and second scan rate are chosen such that the system mills, over the plurality of iterations, both the first and second sub-regions to the same desired depth.

10. The system set forth in claim 8 wherein:
the region further includes a third sub-region adjacent to at least one of the first or second sub-regions and having a third milling rate different from each of the first and second milling rates;
each time the focused ion beam is scanned over the region in the milling step, the beam is further scanned over the third sub-region at a third scan rate different than the first and second scan rates; and
wherein the first, second and third scan rates are selected such that the system mills, over the plurality of iterations, each of the first, second and third sub-regions to the same desired depth.

11. The system set forth in claim 8 wherein each iteration of the milling step removes approximately one atomic layer of material or less from each of the first and second sub-regions.

12. The system set forth in claim 8 wherein the system repeats the milling step at least many thousands of times in order to mill the region to the desired depth.

13. The system set forth in claim 8 wherein the first sub-region comprises a first geometry and the second sub-region comprises a second geometry different than the first geometry.

14. The system set forth in claim 8 wherein the first milling rate is faster than the second milling rate and the first scan rate is faster than the second scan rate.

15. A method of evaluating a region of a sample that includes two or more sub-regions adjacent to each other that have different milling rates, the method comprising:
milling the region by scanning a focused ion beam over a first sub-region of the region having a first milling rate X times and scanning the focused ion beam over a second section of the region having a second milling rate different than the first milling rate Y times, where X and Y are selected to compensate for the difference between the first and second milling rates such that the region is milled a substantially uniform amount;
repeating the milling process a plurality of times to etch the region to a desired depth.

16. The method of evaluating a region set forth in claim 15 wherein each iteration of the milling step removes 100 atomic layers of material or less from each of the first and second sub-regions.

17. The method of evaluating a region set forth in claim 15 wherein the milling step is repeated at least many thousands of times in order to mill the region to the desired depth.

18. A system for evaluating a region of a sample that includes a first sub-region having a first milling rate and a second sub-region, adjacent to the first sub-region, having a second milling rate different than the first milling rate, the system comprising:
a vacuum chamber;
a sample support configured to hold a sample within the vacuum chamber during a sample evaluation process;
a focused ion beam (FIB) column configured to direct a charged particle beam into the vacuum chamber;
a processor and a memory coupled to the processor, the memory including a plurality of computer-readable instructions that, when executed by the processor, cause the system to:
mill the region by scanning a focused ion beam over the first sub-region of the region having a first milling rate X times and scanning the focused ion beam over a second section of the region having a second milling rate different than the first milling rate Y times, where X and Y are selected to compensate for the difference between the first and second milling rates such that the region is milled a substantially uniform amount; and repeat the milling process a plurality of times to etch the region to a desired depth.

19. The system set forth in claim 18 wherein each iteration of the milling step removes 1000 atomic layers of material or less from each of the first and second sub-regions.

20. The system set forth in claim 18 wherein the system repeats the milling step at least many thousands of times in order to mill the region to the desired depth.

* * * * *